United States Patent [19]

Cargille

[11] Patent Number: 4,705,946

[45] Date of Patent: Nov. 10, 1987

[54] INFRARED SENSOR COMPRISING IMPROVED FEEDBACK LIMITED AMPLIFIER AND ASSOCIATED METHOD FOR AMPLIFYING ELECTRONIC SIGNALS

[75] Inventor: Donald R. Cargille, Venice, Calif.

[73] Assignee: Hughes Aircraft Company, Los Angeles, Calif.

[21] Appl. No.: 772,786

[22] Filed: Sep. 5, 1985

[51] Int. Cl.$^4$ ............................................. G01J 5/32
[52] U.S. Cl. ..................................... 250/338; 250/342
[58] Field of Search ............ 250/342, 338 SE, 338 R; 330/293, 110, 85; 329/169; 307/545

[56] References Cited

U.S. PATENT DOCUMENTS

| | | | |
|---|---|---|---|
| 3,225,304 | 12/1965 | Richards | 330/293 |
| 3,550,028 | 12/1970 | Dilley et al. | 330/280 |
| 3,569,719 | 3/1971 | Dryden | 250/203 R |
| 3,770,984 | 11/1973 | Connor et al. | 307/553 |
| 3,920,994 | 11/1975 | Cargille | 250/347 |
| 3,999,060 | 12/1976 | Skagerlund | 250/214 R |
| 3,999,084 | 12/1976 | Beaudette | 307/563 |
| 4,095,126 | 6/1978 | Hoffman et al. | 307/553 |
| 4,138,612 | 2/1979 | Schlesinger | 307/562 |
| 4,533,863 | 8/1985 | Luhn et al. | 322/28 |
| 4,542,350 | 9/1985 | Akazawa et al. | 330/293 |

Primary Examiner—Janice A. Howell
Assistant Examiner—Constantine Hannaher
Attorney, Agent, or Firm—J. A. Sawyer, Jr.; M. J. Meltzer; A. W. Karambelas

[57] ABSTRACT

An improved infrared sensor is provided which is of the type which scans across a spatial region and detects infrared energy radiating from a celestial body and in which an input electronic signal is produced in response to the detected infrared energy, wherein the improvement comprises: amplifier circuit means for providing an amplified output signal in response to the input electronic signal; threshold detection circuit means for detecting when the output electronic signal reaches a prescribed threshold level substantially below a saturation level of said amplifier circuit means said threshold detection circuit means comprising a thresholding circuit for providing a turn-on signal when the output signal reaches the prescribed threshold level; and feedback circuit means for providing a feedback signal for limiting the input electronic signal provided to said amplifier circuit means, said feedback circuit means comprising a feedback amplifier circuit responsive to the turn-on signal, such that the feedback signal is provided when the output signal substantially reaches the prescribed threshold level; wherein a feedback loop comprising said threshold detection circuit means and said feedback circuit means is characterized by a feedback ratio selected to substantially dampen unwanted oscillations in said feedback loop.

15 Claims, 7 Drawing Figures

INFRARED SENSOR COMPRISING IMPROVED FEEDBACK LIMITED AMPLIFIER AND ASSOCIATED METHOD FOR AMPLIFYING ELECTRONIC SIGNALS

BACKGROUND OF THE INVENTION

1. Field of the Invention

The present invention relates to sensors for detecting celestial bodies radiating infrared energy and, more particularly, to electronic circuits utilized in sensors for detecting celestial bodies radiating infrared energy.

2. Description of the Related Art

Spacecraft often use celestial bodies such as the earth or the sun as reference objects. Data regarding the position or attitude of the spacecraft relative to such bodies is used to monitor the spacecraft's progress and to make necessary corrections in its position or attitude. Thus, spacecraft frequently are equipped with sensors for detecting such celestial bodies.

One type of sensor, for example, is an infrared horizon sensor which senses the crossing of a horizon of a celestial body as the spacecraft moves relative to the body. The horizon sensor converts infrared energy radiating from the body into electronic signals which are processed to provide desired information. For example, the time delay between the crossings of the two horizons of a particular celestial body may be compared with a reference time delay, and a resultant electronic error signal may be generated. The error signal then may be used for making appropriate corrections in the spacecraft's attitude relative to the celestial body.

Earlier infrared horizon sensors typically were equipped with an electronic amplifer circuit for amplifying electronic signals generated in response to celestial bodies. Often, an infrared horizon sensor was configured to sense more than one celestial body on a periodic basis, and frequently the intensity of the infrared energy radiating from one periodically sensed celestial body, such as the sun, was significantly greater than that radiating from another periodically sensed celestial body, such as the earth. As a result, the magnitude of the electronic signals generated in response to the celestial body emitting the higher intensity infrared energy often was significantly greater than the magnitude of the electronic signals generated in response to the celestial body emitting the lower intensity infrared energy.

Unfortunately, the magnitude of the electronic signals responsive to the higher intensity body often was so great that it could drive an unprotected electronic amplifier circuit into a saturation condition in which the horizon sensor was temporarily blinded and inoperable. Furthermore, the period of time necessary for the electronic amplifier circuit to recover from the saturation condition could be long enough to mask one or more subsequent sweeps of a reference celestial body, and valuable data regarding the attitude of the spacecraft could be lost.

In order to protect against saturation of an amplifier circuit, earlier infrared horizon sensors often included a limiting circuit for limiting magnitude of the electronic signals provided to the amplifier circuit. While such earlier limiting circuits, generally were successful, there were shortcomings with their use. More particularly, the earlier limiting circuits often were unstable and experienced unwanted loop oscillations due to their inability to satisfactorily meet stability criteria such as gain and phase margins.

Thus, there has been a need for an improved circuit, for use in a sensor for detecting infrared energy radiating from celestial bodies, which is stable and substantially free from unwanted loop oscillations. The present invention meets this need.

SUMMARY OF THE INVENTION

In one embodiment, the present invention comprises an improved infrared sensor of the type which scans across a spatial region and detects infrared energy radiating from a celestial body and in which an input electronic signal is produced in response to the detected infrared energy. The improvement of the present invention comprises an amplifier circuit for providing an amplified output electronic signal in response to the input electronic signal. A threshold detection circuit is included for detecting when the output signal reaches a prescribed threshold level substantially below a saturation level of the amplifier circuit. The threshold detection circuit includes a thresholding circuit for providing a turn-on signal when the output signal reaches the prescribed threshold level. The improvement further comprises a feedback circuit for providing a feedback signal for limiting an electronic signal provided to the electronic amplifier circuit. The feedback circuit comprises a feedback amplifier circuit responsive to the turn-on signal, such that the feedback signal is provided when the output signal substantially reaches the prescribed threshold level. A feedback loop comprising the threshold detection circuit and the feedback circuit is characterized by a feedback ratio selected to substantially dampen unwanted oscillations in the feedback loop.

The present invention also comprises a method for use in conjunction with an infrared sensor of the general type described above. The method includes the steps of amplifying the input electronic signal to provide a corresponding output signal and of detecting when the output signal reaches a prescribed threshold level. The method also includes the steps of providing a feedback signal when the output signal reaches the prescribed threshold level, the feedback signal being characterized by a feedback ratio selected to substantially dampen unwanted oscillations of the feedback signal. The method further includes the step of limiting the input signal in response to the feedback signal.

The present invention, therefore, provides an improved sensor comprising a feedback limited amplifier circuit and associated method in which an output signal level is limited by a feedback signal characterized by a prescribed feedback ratio. The prescribed feedback ratio is selected such that unwanted oscillations in the circuit are substantially prevented. Thus, the sensor can scan across a spatial region including celestial bodies radiating relatively high intensity infrared energy substantially without saturating the amplifier circuit and substantially without the danger that the amplifier circuit will become unstable and inoperable due to unwanted oscillations.

These and other features and advantages of the present invention will become more apparent from the following detailed description of an exemplary embodiment thereof, as illustrated in the accompanying drawings.

BRIEF DESCRIPTION OF THE DRAWINGS

The purpose and advantages of the present invention will be apparent to those skilled in the art from the following detailed description in conjunction with the appended drawings in which.

DETAILED DESCRIPTION OF THE PREFERRED EMBODIMENT

The present invention comprises an improved feedback limited amplifier circuit for use in conjunction with a sensor for detecting infrared energy radiating from a celestial body. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1:
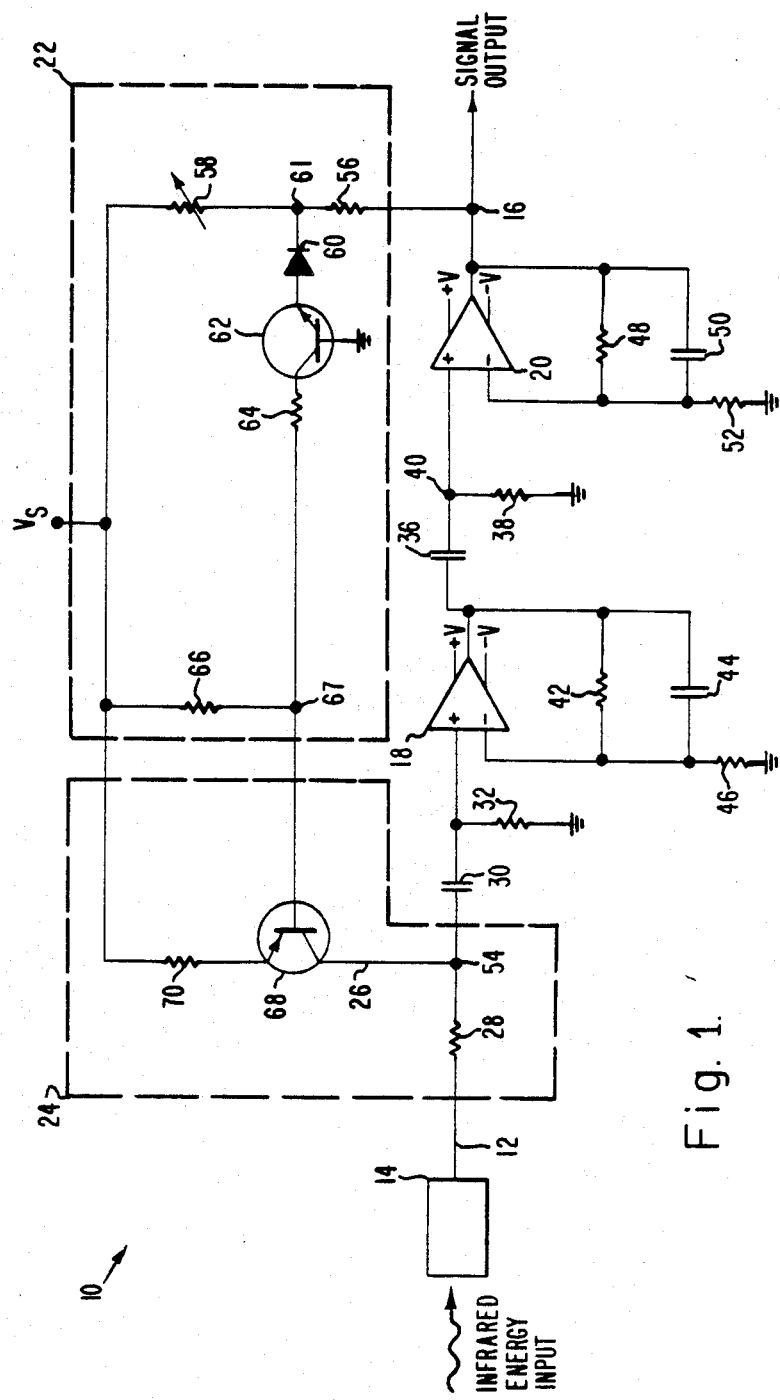
FIG. 1 is a schematic diagram of a preferred embodiment of the present invention.

Referring to FIG. 1, a schematic diagram of a presently preferred embodiment of an improved feedback limited electronic amplifier circuit 10 of the present invention is shown. The electronic amplifier circuit 10 receives on line 12 electronic signals generated in response to infrared radiant energy detected and preamplified by an infrared detector system 14. The improved amplifier circuit 10 comprises a two-stage amplifier circuit including first and second amplifiers, 18 and 20, respectively, which amplify the input signals and provide amplified versions of the input signals as output electronic signals at output node 16. The improved amplifier circuit 10 includes a thresholding common base amplifier, shown substantially within the dashed lines labelled 22, for detecting when the output signal reaches a prescribed threshold level. It also includes an analog signal inverter, shown substantially within the dashed lines labelled 24, for providing a feedback signal on line 26 when the output signal reaches the prescribed threshold. Finally, the improved amplifier 10 includes a summing resistor 28 for summing an opposing feedback signal with the input electronic signal on line 12 in response to the feedback signal on line 26.

More particularly, the infrared detector system 14 is electrically connected by line 12 to one terminal of the summing resistor 28. The infrared detector system 14 forms no part of the present invention, and a description thereof is not essential to support the claims or to provide an adequate disclosure of the present invention. However, in the interest of completeness, the disclosure of U.S. Pat. No. 3,920,994, issued to Donald R. Cargille on Nov. 18, 1975, which discloses an exemplary infrared detector system, is incorporated herein by this reference. The other terminal of the summing resistor 28 is connected to one terminal of a first coupling capacitor 30 which is connected in series with the summing resistor 28. The other terminal of the first coupling capacitor 30 is electrically connected to the noninverting terminal of the first operational amplifier 18. A first DC return resistor 32 has one terminal electrically connected between the first coupling capacitor 30 and the noninverting terminal of the first operational amplifier 18, and has another terminal connected to electrical ground.

The output of the first operational amplifier 18 is electrically connected to one terminal of a second coupling capacitor 36. The other terminal of the second coupling capacitor 36 is connected to the noninverting terminal of the second operational amplifier 20. A second DC return resistor 38 has one terminal electrically connected between the second coupling capacitor 36 and the noninverting terminal of the second operational amplified 20, and has another terminal connected to electrical ground.

First feedback resistor 42 and first feedback capacitor 44 are electrically connected in parallel with one another between the inverting terminal and the output terminal of the first operational amplifier 18. A first stage gain set resistor 46 is electrically connected between the inverting terminal of the first operational amplifier 18 and electrical ground.

Second feedback resistor 48 and second feedback capacitor 50 are electrically connected in parallel with one another between the inverting terminal and the output terminal of the second operational amplifier 20. A second stage gain set resistor 52 is electrically connected between the inverting terminal of the second operational amplifier 20 and electrical ground.

Power supply voltages $+V$ and $-V$ are provided to each of the operational amplifiers 18 and 20 to provide DC power to the amplifiers.

The thresholding common base amplifier and the analog signal inverter, shown substantially enclosed within the dashed lines labelled 22 and 24 respectively, comprise an electronic feedback circuit electrically connected between the output node 16 and an input node 54 interposed between the series connected summing resistor 28 and the first coupling capacitor 30.

Emitter resistor 56 has one terminal connected to output node 16. Its other terminal is connected to one terminal of threshold setting resistor 58. Node 61 is interposed between emitter resistor 56 and threshold setting resistor 58 which are connected in series. The other terminal of the threshold setting resistor 58 is electrically connected to a voltage source $V_S$. The cathode of a protection diode 60 is electrically connected to a node 61, and the anode of protection diode 60 is electrically connected to the emitter of an npn-type thresholding first transistor 62. The base of the first transistor is electrically connected to ground, and its collector is connected to one terminal of turn-on transient limiting resistor 64. The other terminal of the turn-on transient limiting resistor 64 is electrically connected to one terminal of collector resistor 66. The other terminal of collector resistor 66 is electrically connected to the voltage source $V_S$. Node 67 is interposed between turn-on transient limiting resistor 64 and collector resistor 66. Components 56-66 substantially comprise the thresholding common base amplifier shown substantially enclosed within dashed lines 22.

The base of a pnp-type feedback second transistor 68 is electrically connected to a node 67. The emitter of the feedback second transistor 68 is electrically connected to one terminal of emitter resistor 70. The other terminal of emitter resistor 70 is electrically connected to voltage source $V_S$. The collector of the feedback second transistor 68 is connected by line 26 to the input node 54. Components 26, 28, 68 and 70 substantially comprise the analog signal inverter shown substantially enclosed within dashed lines 24.

Component values and supply voltages for the improved feedback limited amplifier circuit of the presently preferred embodiment are tabulated below.

| COMPONENTS | VALUES |
| --- | --- |
| Resistors: | |
| 28 | 1K |
| 32 | 392K |
| 38 | 392K |
| 42 | 71K |
| 46 | 1K |
| 48 | 71K |
| 52 | 1K |
| 56 | 10K |
| 64 | 10K |
| 66 | 5K |
| 70 | 1K |
| 58 | * |
| Capacitors: | |
| 30 | 6 µF |
| 36 | 6 µF |
| 44 | 10 nF |
| 50 | 10 nF |
| Operational Amplifiers: | |
| 18 | OP-02 |
| 20 | OP-02 |
| Transistors: | |
| 62 | 2N2484 |
| 68 | 2N2907A |
| Diode: | |
| 60 | 1N3600 |

*The value is selected to achieve the desired limit level.

The voltage source $V_S$ has a value of +18 volts. The power supply voltages +V and −V are +18 volts and −18 volts, respectively.

Figure 2:
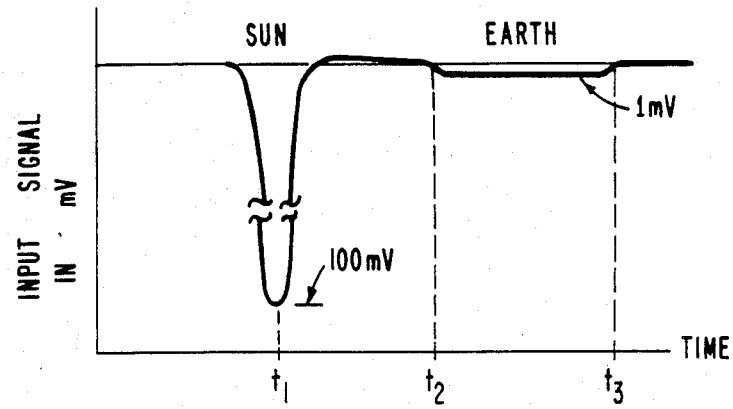
FIG. 2 is an exemplary graph illustrating typical input signal voltage levels provided to the preferred embodiment of FIG. 1.

In operation, the infrared detector system 14 detects energy in the infrared spectrum radiating from celestial bodies and generates on line 12 a corresponding negative polarity input electronic voltage signal which is substantially proportional in magnitude to the intensity of the detected infrared energy. The graph of FIG. 2 illustrates typical exemplary input signal waveforms generated by the infrared detector system 14 when the radiating bodies are the sun and the earth. The magnitude of the input signal generated as a result of relatively high intensity infrared radiation from the sun is approximately 100 mV; while the magnitude of the input signal generated as a result of the relatively lower intensity infrared radiation from the earth is approximately 1 mV.

Figure 3:
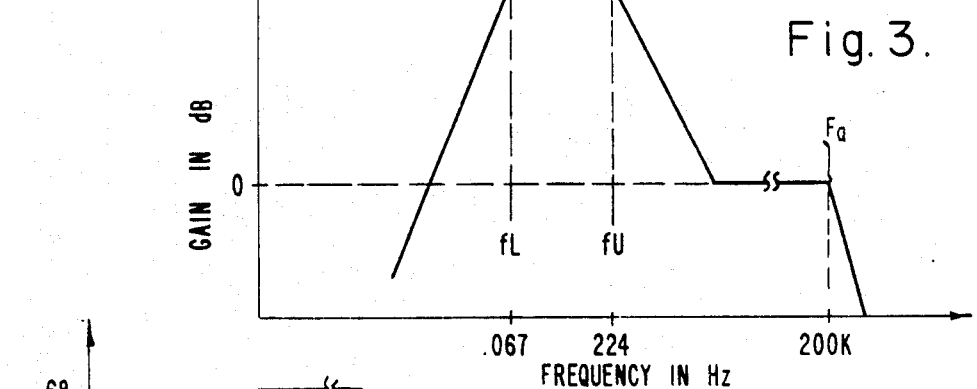
FIG. 3 is an exemplary bode plot of the forward gain of the two stage amplifier circuit of the preferred embodiment of FIG. 1.

The amplification applied to input signal on line 12 by the two stage amplifier circuit comprising the respective first and second amplifier circuits 18 and 20 will be appreciated from FIG. 3 which illustrates an exemplary open loop bode plot of the two stage amplifier circuit. The midband gain is approximately 74 dB. The upper frequency break point $F_u$ substantially is $\frac{1}{2}\pi(71\times 10^3)(10\times 10^{-9})$ or 224 Hz, and the lower frequency break point $F_l$ substantially is $\frac{1}{2}\pi(392\times 10^3)(6\times 10^{-6})$ or 0.067 Hz. The upper and lower frequency break points are selected to be consistent with the spin rate of a spinning satellite on which the improved amplifier circuit 10 is mounted, although the improved amplifier circuit 10 is not limited to use on spinning satellites. The upper and lower frequency rolloffs both are approximately 40 dB/decade; the first and second operational amplifiers 18 and 20, respectively, contribute approximately 20 dB/decade each to the respective high and the low frequency rolloffs. The operational amplifier break frequency $F_a$ is approximately 200 kHz for the two-stage circuit. The flat horizontal portion of the bode plot between the upper break frequency $F_u$ and the OP-AMP break frequency $f_a$ shows a gain of substantially 0 dB. This flat portion and the value of $F_a$ have negligible effect on signal amplification, but they are important to the closed loop limiter stability as will be discussed below.

The thresholding common base amplifier shown in FIG. 1 substantially within dashed lines 22 detects when the output signal reaches a prescribed threshold level at which feedback limiting is to begin. More specifically, the prescribed threshold output voltage measured at output node 16 at which limiting of the two stage amplifier circuit occurs is set by appropriate adjustment of the adjustable resistor 58. For example, with the threshold setting resistor 58 set at 37K ohms the prescribed threshold voltage is approximately −7 volts.

When the output voltage is still less negative than the prescribed threshold level (the two-stage amplifier circuit of the presently preferred embodiment is a negative polarity circuit), the voltage source $V_S$ and the voltage divider action of the threshold setting resistor 58 and the emitter resistor 56 provide a reverse bias voltage to node 61 and to the cathode of the protection diode 60. The protection diode 60 protects the emitter junction of the thresholding first transistor 62 from breakdown due to excessive reverse bias voltages when the output voltage is less negative than the threshold level.

The reverse bias voltage applied at node 61 reverse biases the emitter-base junction of the thresholding first transistor 62 and substantially prevents current flow from the collector to the emitter of the thresholding first transistor 62. Furthermore, the reverse bias causes the emitter-base junction of the second transistor 68 to be zero biased; so substantially no current flows from the collector to the emitter in the feedback second transistor 68. Therefore, substantially no feedback current flows on line 26 to the summing resistor 28, and the improved feedback limited amplifier circuit 10 of the preferred embodiment operates as a two-stage amplifier circuit providing 74 dB gain in the midband region.

When the output voltage at output node 16 becomes more negative than the prescribed threshold level, the voltage applied at node 61 also falls. When the threshold setting resistor 58 is set substantially at 37K ohms, and the voltage at node 61 becomes more negative than approximately −7 volts, the protection diode 60 and the emitter base junction of the first transistor 62 becomes forward biased. Consequently, current begins to flow through collector resistor 66 and turn-on-transient limiting resistor 64 to the collector junction of the first transistor 62. As a result, the emitter-base junction of the feedback second transistor 68 will move into the active region, and the feedback second transistor 68 will begin to conduct current from its emitter to its collector. Current flowing from the collector of the feedback second transistor 68 on line 26 to the summing resistor 28 comprises a feedback signal which will cause a voltage drop across the summing resistor 28 opposite from the voltage drop due to the signal voltage received on line 12 from the infrared detector 14. Thus, the input signals at input node 54 will be limited as a result of the feedback signal on line 26.

The first transistor 62 is connected as a common base amplifier. The resistance ratio of emitter resistor 56 to collector resistor 66 is substantially 10K:5K. Therefore, the ratio of the voltage drop across the emitter resistor 56 to the voltage drop across the collector resistor 66 is approximately 2:1. Turn-on transient limiting resistor 64 is provided to limit potentially damaging current transients during turn-on of the respective first or second transistors 62 and 68 and has substantially no impact on the relative voltage drops across emitter resistor 56 and collector resistor 66.

The feedback second transistor 68 is connected as an analog signal inverter. Since the resistance ratio of emitter resistor 70 to the summing resistor 28 substantially is 1:1, the voltage drop across the summing resistor 28 due to the feedback signal on line 26 will be substantially one-half of the voltage drop across the emitter resistor 56. Therefore, the feedback ratio of the circuit comprising the thresholding common base amplifier within dashed lines 22 and the analog signal inverter within dashed lines 24 is substantially ½ or −6 dB.

Figure 4:
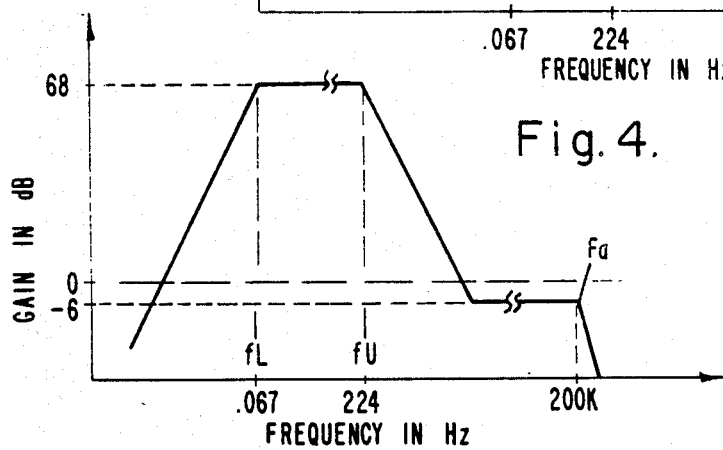
FIG. 4 is an exemplary bode plot of the loop gain of the two stage amplifier circuit and the feedback limiting circuit of the preferred embodiment of FIG. 1.

The feedback limiting applied by the thresholding common base amplifier within dashed lines 22 and the analog signal inverter within dashed lines 24, will be appreciated from the drawings of FIG. 4 which represent an exemplary bode plot of the closed loop circuit comprising the respective first and second amplifers 18 and 20, the thresholding common base amplifier, and the analog signal inverter. The midband gain is approximately 68 dB, reflecting the −6 dB gain contribution from the feedback limiting circuit. The upper frequency breakpoint $F_u$ substantially is 224 Hz, and the lower frequency breakpoint $F_l$ is substantially 0.067 Hz. The upper and lower frequency rolloffs each are approximately 40 dB/decade. The OP-AMP break frequency $F_a$ for the two stage operational amplifier is approximately 200 kHz. The flat substantially horizontal portion of the bode plot between the upper frequency breakpoint $F_u$ and the OP-AMP break, frequency shows a gain of −6 dB.

Figure 5:
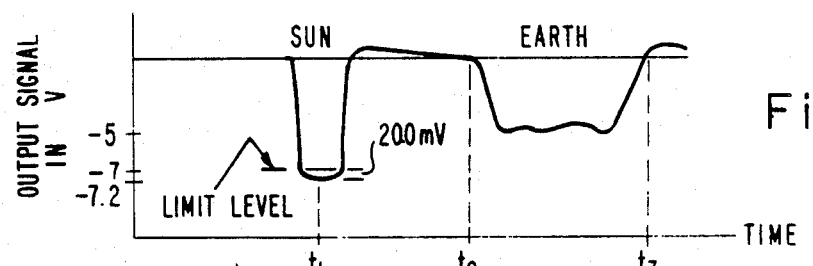
FIG. 5 is an exemplary graph illustrating typical output signal voltage levels provided by the preferred embodiment of FIG. 1.

The curve of FIG. 5 illustrates exemplary feedback limited output signals generated in response to relatively high intensity infrared radiation from the sun and relatively lower intensity infrared radiation from the earth. Comparing the graphs of FIGS. 2 and 5, one will appreciate that times labelled $t_1$, $t_2$ and $t_3$ on FIG. 2 correspond in time to similarly labelled times in FIG. 5. The portion of the output signal curve generated in response to infrared energy radiated by the sun is substantially limited, for example, at −7 volts to prevent saturation of the two-stage amplifier circuit. Although the output voltage resulting from the sun extends to a peak approximately 200 mV below the −7 volt limit level due to amplification of the 100 mV input signal by a factor of two due to the feedback ratio of ½ or −6 dB, the 200 mV peak is negligible. The portion of the curve which illustrates the output signal generated in response to infrared energy radiated from the earth is not limited because the output signal has a voltage level which is not negative enough to cause saturation of the negative polarity two-stage amplifier circuit comprising the respective first and second operational amplifiers 18 and 20. The output voltage resulting from the earth is approximately −5 volts.

Figure 6:
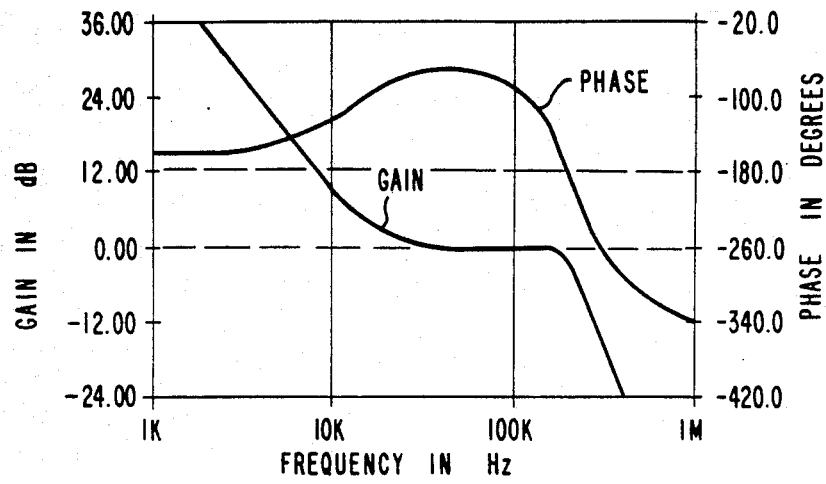
FIG. 6 is an exemplary pair of curves illustrating the phase versus frequency and gain versus frequency performance of the two-stage amplifier portion of the preferred embodiment of FIG. 1.
Figure 7:
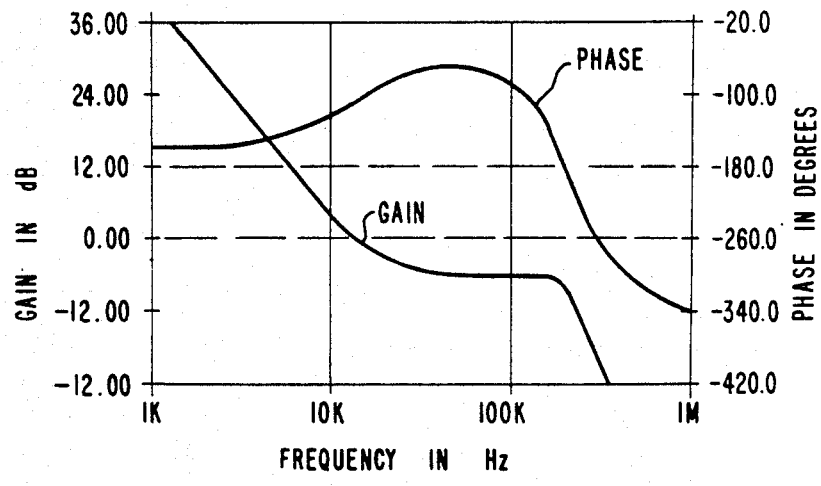
FIG. 7 is an exemplary pair of curves illustrating the phase versus frequency and gain versus frequency performance of the two-stage amplifier and the feedback limiting circuit of the preferred embodiment of FIG. 1.

The advantage realized by the improved feedback limited electronic circuit 10 of the present invention will be understood from the drawings of FIGS. 6 and 7 and the following discussion. FIG. 6 illustrates exemplary gain versus frequency and phase versus frequency curves for the open loop two-stage forward amplifier portion of the improved circuit 10; thus, it illustrates circuit performance absent the feedback limiting provided by the circuit components enclosed within dashed lines 22 and 24. FIG. 7 illustrates exemplary gain versus frequency and phase versus frequency curves for the entire improved circuit; thus, it illustrates circuit performance with the limiting provided by the circuit components enclosed within dashed lines 22 and 24. The curves of FIGS. 6 and 7 illustrate performance in the region of high frequency gain crossover (where the gain curve crosses through 0 dB). The relatively steep slope of the gain versus frequency curve between 100 kHz and 1 MHz is due to the finite bandwidth $F_a$, of the operational amplifiers 18 and 20.

Two well-known and generally accepted measures of stability for closed loop amplifier circuits of the general type disclosed in the present invention are the phase margin and the gain margin. Any negative feedback loop, including the loop embodied in the present invention, will be unstable and experience unwanted oscillations if the phase at the gain crossover frequency is more negative then −180 degrees. The gain crossover frequency is the frequency at which the gain is 0 dB. The phase margin is defined as the actual phase at the gain crossover frequency plus 180 degrees. The gain margin is defined as the negative of the actual loop gain at a frequency at which the phase is −180 degrees. In typical closed amplifier circuits of the type disclosed in the present invention, a phase margin of substantially 45 degrees or more and a gain margin of substantially 6 dB or more represent satisfactory stability.

Referring to FIG. 6, the phase at the high frequency gain crossover is approximately −70 degrees. Therefore, the phase margin is approximately (−70+180) degrees or 110 degrees which is satisfactory. The gain margin, however, is approximately 1.5 dB, indicating only marginal stability. Thus, the open loop two-stage forward amplifier portion of the improved circuit 10 is not satisfactorily stable and may experience unwanted oscillations.

Referring now to FIG. 7, the phase at the high frequency gain crossover is approximately −105 degrees. Therefore, the phase margin is approximately (−105+180) degrees or 75 degrees which is satisfactory. Furthermore, the gain margin is approximately 7.5 dB which also is satisfactory. Thus, the improved feedback limited amplifier circuit 10 exhibits satisfactory stability.

One skilled in the art will appreciate that the feedback ratio of the components within dashed lines 22 and 24 of the circuit 10 illustrated in FIG. 1 is selected such that the phase margin and the gain margin fall within acceptable limits within which the circuit 10 exhibits satisfactory stability. Although the feedback ratio of −6 dB was selected for the circuit 10 of the preferred embodiment described above, one will appreciate that a deviation from the −6 dB feedback ratio of up to approximately ±3 dB will still provide a substantially stable circuit 10.

Furthermore, the circuit components enclosed within dashed lines 22 and 24 in FIG. 1 do not include reactive elements which could introduce phase shifts. Therefore, for example, the values of the respective first and second feedback capacitors 44 and 50 and the values of the respective first and second feedback resistors 42 and 48 can be changed without adversely affecting the stability of the circuit 10. Thus, the circuit 10 may be modified, for example, to change the upper and lower frequency break points $F_u$ and $F_1$, respectively, and/or the gain in the mid-band region, substantially without suffering reduced stability.

It will be understood that the embodiment described above is merely illustrative of many possible specific embodiments which can represent the principles of the invention. Numerous and varied other arrangements can readily be devised in accordance with these principles without departing from the spirit and scope of the invention. For example, although the presently preferred embodiment represents a negative polarity circuit, those skilled in the art will appreciate that the same principles will apply to a positive polarity circuit. Thus, the foregoing description is not intended to limit the invention which is defined by the appended claims in which:

What is claimed is:

1. An improved infrared sensor of the type which scans across a spatial region and detects infrared enegy radiating from a celestial body and in which an input electronic signal is produced in response to the detected infrared energy, wherein the improvement comprises:
   amplifier circuit means for providing an amplified output electronic signal is response to the input electronic signal; and
   a feedback loop containing only substantially nonreactive components, the feedback loop comprising;
   threshold detection circuit means for detecting when the output electronic signal reaches a prescribed threshold level substantially below a saturation level of said amplifier circuit means, said threshold detection circuit means comprising a thresholding circuit for providing a turn-on signal when the output signal reaches the prescribed threshold level; and
   feedback circuit means for providing a feedback signal for limiting the input electronic signal provided to said electronic amplifier circuit means said, feedback circuit means comprising a feedback amplifier circuit responsive to the turn-on signal, such that the feedback signal is provided when the output signal substantially reaches the prescribed threshold level;
   wherein the feedback loop is characterized by a feedback ratio selected to substantially dampen unwanted oscillations in said feedback loop.

2. The sensor of claim 1 wherein said thresholding circuit comprises an amplifier circuit.

3. The sensor of claim 1 wherein said threshold detection circuit means comprises a thresholding common base amplifier circuit.

4. The sensor of claim 1 or 3 wherein said feedback circuit means comprises an analog signal inverter.

5. An improved infrared sensor of the type which scans aross a spatial region and detects infrared energy radiating from a celestial body and in which an input electronic signal is produced in response to the detected ifrared energy, wherein the improvement comprises:
   amplifier circuit means for providing an amplified output signal in response to the input electronic signal; and
   a feedback loop including only substantially nonreactive components, the feedback loop comprising;
   threshold detection circuit means for detecting when the output electronic signal reaches a prescribed threshold level substantially below a saturation level of said amplifier circuit means, said threshold detection circuit means including at least one thresholding transistor which is substantially reverse biased before the output signal reaches the prescribed threshold level and which is substantially forward biased when the output signal reaches the prescribed threshold level; and
   feedback circuit means for providing a feedback signal for limiting an electronic signal provided to said amplifier circuit means when the output signal substantially reaches the prescribed threshold level;
   wherein the feedback loop is characterized by a feedback ratio selected to substantially dampen unwanted oscillations in said feedback loop.

6. The sensor of claim 5 wherein said feedback circuit means comprises at least one feedback transistor which is responsive to said thresholding transistor, said feedback transistor substantially becoming forward biased when said thresholding transistor becomes forward biased.

7. The sensor of claims 1, 2, 3 or 4 wherein said threshold detection means includes means for adjusting the prescribed threshold level.

8. The sensor of claims 1, 2, 5 or 6 wherein the feedback ratio is substantially between −3 dB and −9 dB.

9. The sensor of claims 1, 2, 5 or 4 wherein the prescribed feedback ratio is selected such that the feedback loop is characterized by a gain margin and a phase margin substantially greater than 6 dB and 45 degrees, respectively.

10. The sensor of claims 1, 2, 5 or 4 wherein the prescribed feedback ratio is substantially −6 dB.

11. The sensor of claims 1, 2, 5 or 6 wherein said amplifier circuit means comprises a multiple stage amplifier circuit.

12. The sensor of claims 1, 2, 5 or 6 wherein said amplifier circuit means comprises a two-stage amplifier circuit.

13. In an infrared sensor of the type which scans across a spatial region and detects infrared energy radiating from a celestial body and in which an input electronic signal is produced in response to the detected infrared energy, a method for substantially preventing unwanted oscillations of feedback signals comprising the steps of:
   amplifying the input electronic signal to provide a corresponding output electronic signal;
   detecting when the output signal reaches a prescribed threshold level;
   providing a feedback signal which is substantially independent of the phase of the input signal when the output signal reaches the prescribed threshold level, the feedback signal being characterized by a feedback ratio selected to substantially dampen unwanted oscillations of the feedback signal; and limiting the input signal in response to the feedback signal.

14. The method of claim 13 wherein the feedback ratio is substantially between −3 dB and −9 dB.

15. The method of claim 13 wherein the feedback ratio is substantially −6 dB.

* * * * *